(12) United States Patent
Williamson et al.

(10) Patent No.: US 7,853,425 B1
(45) Date of Patent: Dec. 14, 2010

(54) PARALLEL TESTING IN A PER-PIN HARDWARE ARCHITECTURE PLATFORM

(75) Inventors: Jerold A. Williamson, Twinsburg, OH (US); Michael Chao, Aurora, OH (US); Joseph N. Furio, Parma Heights, OH (US); Miao Lei, Beijing (CN)

(73) Assignee: Keithley Instruments, Inc., Cleveland, OH (US)

( * ) Notice: Subject to any disclaimer, the term of this patent is extended or adjusted under 35 U.S.C. 154(b) by 270 days.

(21) Appl. No.: 12/171,765

(22) Filed: Jul. 11, 2008

(51) Int. Cl.
*G01R 31/28* (2006.01)
*G06F 11/263* (2006.01)

(52) U.S. Cl. .............. 702/123; 702/108; 702/117; 702/120; 324/73.1; 714/724; 714/742

(58) Field of Classification Search ............ 702/123, 702/108, 117, 120
See application file for complete search history.

(56) References Cited

U.S. PATENT DOCUMENTS

| | | | |
|---|---|---|---|
| 7,240,258 B1 * | 7/2007 | Hayes | 714/724 |
| 7,680,619 B1 * | 3/2010 | Lei | 702/108 |
| 2004/0093180 A1 * | 5/2004 | Grey et al. | 702/123 |
| 2005/0102589 A1 * | 5/2005 | Park et al. | 714/718 |
| 2006/0195747 A1 * | 8/2006 | Pramanick et al. | 714/742 |
| 2008/0164894 A1 * | 7/2008 | Kim et al. | 324/754 |

\* cited by examiner

*Primary Examiner*—Hal D Wachsman
(74) *Attorney, Agent, or Firm*—Pearne & Gordon LLP

(57) ABSTRACT

Provided is a method and system for testing a DUT. The system includes a plurality of testing devices for interacting with the DUT and conducting a plurality of different tests on the DUT, and a computer-readable memory for storing computer-executable instructions defining the plurality of tests to be conducted by the testing device on the DUT. A scheduler component designates at least a first test and a second test from the plurality of tests to be conducted on the DUT in parallel, wherein said designating is based at least in part on content of the computer-executable instructions defining the first test and the second test. And a controller initiates the first test and the second test to be conducted in parallel and initiating at least a third test sequentially relative to at least one of the first and second tests.

14 Claims, 4 Drawing Sheets

PARALLEL TESTING IN A PER-PIN HARDWARE ARCHITECTURE PLATFORM

BACKGROUND OF THE INVENTION

1. Field of the Invention

The present invention is directed generally toward the automatic testing of electrical materials, components and circuits and, more specifically, to a system and method of conducting two or more automatic tests in parallel to minimize the time required to complete said automatic tests.

2. Description of Related Art

Electronic device manufacturers typically produce mass quantities of integrated circuits and other such electronic circuit components that will be included in electronic devices eventually sold to end users. Due to the volume of electronic components manufactured, several production testing devices are situated throughout the production floor to conduct tests on a suitably large sample of the electronic components and electric circuits to provide reasonable assurance that the circuits, or portions thereof function as designed. For critical applications every circuit, material, circuit component or other device produced must be tested to ensure that said items function properly. However, there is a practical limit of the number of testing device that can be utilized due to space and budget constraints. Thus, to maximize production throughput the time spent by each testing device to ensure proper operation of the items being produced must be shortened as much as possible.

Each testing device includes the required hardware to interface with a portion of the electrical materials, components and/or circuits to be tested, generally referred to herein as a device under test, and measure the value of an electrical property of the device under test that indicates whether the device under test operates as designed. In addition to the appropriate hardware, each testing device also includes a controller and a computer-readable memory storing computer-executable instructions that define tasks to be carried out by the testing device. The computer-executable instructions are to be executed by the controller to perform the desired tests. Typically, there are a number of tests to be performed at various locations of the device under test. These tests may be dynamic. Some tests require one or more other tests to be finished before being initiated, and should not be initiated immediately upon the initially scheduled start time as assigned by the controller. Initiation of such tests can not be scheduled until all of the tests to be conducted are known, and only then get scheduled for execution in proper combinations and sequences. However, compatible tests can be performed at the same time, or at least at overlapping times, to complete the compatible tests with maximum efficiency.

Additionally, each test to be conducted by the testing device requires the testing device to dedicate the necessary resources required to conduct the tests. A first test requiring a certain resource will prevent another test requiring this same system resource from being performed until the first test is no longer utilizing that system resource. Thus, resource conflicts should be avoided while conducting parallel tests to ensure the integrity of the test results.

Certain devices under test will also include different portions thereof that, while undergoing testing will affect operation of other portions of the same device under test. Unless the affect on the other portions of the device under test are well understood and can be compensated for, parallel testing of these interacting portions of the device under test should also be avoided.

To minimize the impact of these concerns, traditional parametric tests have typically been conducted sequentially, which requires performing only a single test of the device under test at one time. Once one test was completed the next test was initiated. In contrast, conducting tests in parallel allows multiple instruments to connect with multiple portions of the same device under test, with multiple devices under test at the same time, or a combination thereof, and conduct multiple tests that at least partially overlap in time. Such tests force signals and measure responses of the device(s) under test at the same time, or, in parallel. This technique is extremely useful when throughput of a production line is critical.

However, managing and controlling the tests that can be performed in parallel requires significant manual intervention, often requiring the computer-executable instructions defining the test parameters to include express identification of other, conflicting tests that can not be performed in parallel. Such conflicts can be due to dependency issues (e.g., one test to be performed depends on the results of a preceding test), usage of common testing device resources, unacceptable interaction between the portions of the device under test, and the like. Even for a relatively simple set of tests to be performed the time, cost and effort required to coordinate parallel execution of the tests is significant. And when even a single test is to be altered in any way it may be necessary to revisit all potential conflicts throughout all of the tests, once again requiring the significant outlay of time, money and effort to bring the testing devices back online.

Accordingly, there is a need in the art for a method and system for conducting parallel tests on a device under test to minimize the time required to complete said testing. The method and system can optionally identify potential conflicts between tests that would prevent those tests from being performed in parallel automatically. Further, the method and system can optionally facilitate integration of additional tests and/or changes to an existing test to be performed with minimal user intervention.

BRIEF SUMMARY OF THE INVENTION

According to one aspect, the present invention provides a method and system for testing a DUT. The system includes a plurality of testing devices for interacting with the DUT and conducting a plurality of different tests on the DUT, and a computer-readable memory for storing computer-executable instructions defining the plurality of tests to be conducted by the testing device on the DUT. A scheduler component designates at least a first test and a second test from the plurality of tests to be conducted on the DUT in parallel, wherein said designating is based at least in part on content of the computer-executable instructions defining the first test and the second test. And a controller initiates the first test and the second test to be conducted in parallel and initiating at least a third test sequentially relative to at least one of the first and second tests.

According to another aspect, the present invention provides a method of testing a DUT to determine if the DUT is functioning properly. The method includes querying computer-executable instructions defining a plurality of tests stored by a computer-readable medium for a conflict between the tests, wherein the conflict interferes with conducting the tests in parallel, and based on the querying, scheduling a first test and a second test that is compatible with the first test to be conducted on the DUT in parallel. Based on the querying, a third test that conflicts with the first test to be conducted on the DUT is initiated sequentially relative to the first test.

BRIEF DESCRIPTION OF THE DRAWINGS

The invention may take physical form in certain parts and arrangement of parts, embodiments of which will be described in detail in this specification and illustrated in the accompanying drawings which form a part hereof and wherein.

DETAILED DESCRIPTION OF ILLUSTRATIVE EMBODIMENTS

Figure 1:
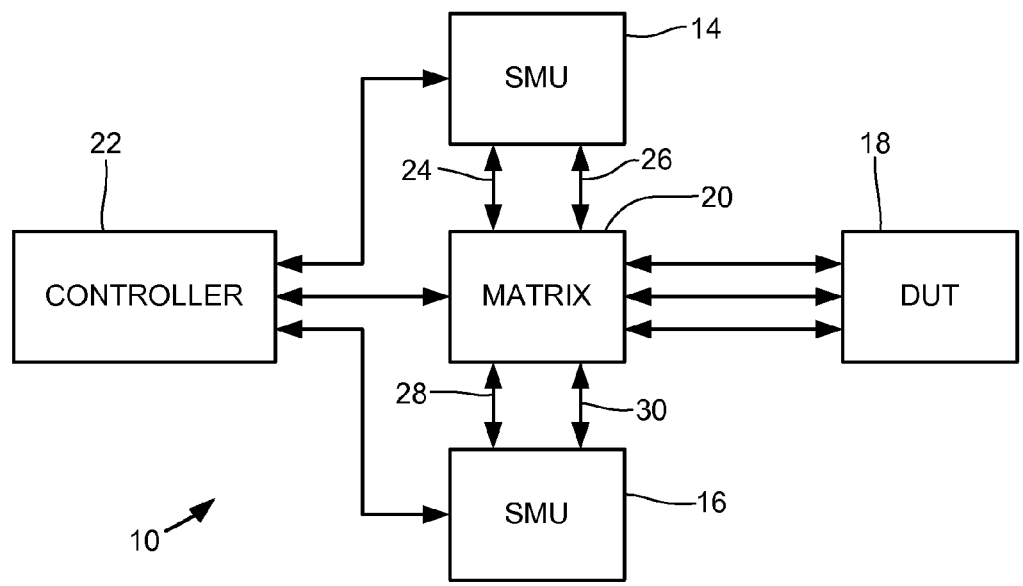
FIG. 1 shows a block diagram illustrating an embodiment of a measurement system interfacing with a DUT according to the present invention.

Certain terminology is used herein for convenience only and is not to be taken as a limitation on the present invention. Relative language used herein is best understood with reference to the drawings, in which like numerals are used to identify like or similar items. Further, in the drawings, certain features may be shown in somewhat schematic form.

It is also to be noted that the phrase "at least one of" followed by a plurality of members herein means one of the members, or a combination of more than one of the members. For example, the phrase "at least one of a first widget and a second widget" means in the present application: the first widget, the second widget, or the first widget and the second widget. Likewise, "at least one of a first widget, a second widget and a third widget" means in the present application: the first widget, the second widget, the third widget, the first widget and the second widget, the first widget and the third widget, the second widget and the third widget, or the first widget and the second widget and the third widget.

Referring to FIG. 1, a measurement system 10 includes a plurality of testing devices 14, 16 that are electrically connectable to a device under test ("DUT") 18. In this example, the connections are made through a switching matrix 20 that can selectively establish electric connections between the DUT and testing devices 14, 16, as well as isolate one or more of the testing devices 14, 16 from the DUT 18. The matrix 20 can include any suitable switching devices, such as a network of reed relays, for example, and is operatively controlled by a test controller 22, which also controls the operation of the testing devices 14, 16.

The two or more testing devices 14, 16 evaluate an electric or other type of signal transmitted by the DUT 18 during a test according to a test recipe to determine if the DUT 18 is operable as designed. The DUT 18 can be an integrated circuit, or any other type of electric circuit to be tested to ensure its functionality satisfies predetermined design criteria. Other types of DUTs 18 can include a biocircuit, a photonic circuit, quantum technology circuits, and the like. The testing device(s) 14, 16 may be, for example, a voltmeter, ammeter, source-measure unit, ohmmeter, inductance meter, capacitance meter, frequency meter, as well as any other instrument for evaluating, and optionally measuring an electric property or other property of the DUT 18 during the test to assess the functionality of the DUT 18. Each of the testing devices provided to the measurement system 10 are not necessarily the same kind of instrument, but can include a plurality of different types of testing devices suitable to make the desired measurements during testing of the DUT 18. In addition, one or more of the testing devices 14, 16 can optionally incorporate a source for energizing, or otherwise stimulating for testing purposes at least a portion of the DUT 18 during a test. Further, the testing devices 14, 16 can optionally be provided as portions of a common testing unit with a selector to allow selection of the appropriate testing device 14, 16 to be utilized in conducting a test.

Under control of the controller 22, the matrix 20 selects which of the test lines 24, 26, 28, 30 are to establish an electric connection between the testing devices 14, 16 and the DUT 18. The controller 22 may include, for example, a pc computer, or other microprocessor-controlled, programmable device, and the like. As such, the controller 22 can include a central processing unit ("CPU") including a microprocessor such as those manufactured by INTEL® and ADVANCED MICRO DEVICES®, for example, and any additional computational architecture to execute instructions defined by computer-readable logic; volatile memory such as random-access memory ("RAM"); and a non-volatile computer-readable memory 32 such as a solid state or magnetic hard disk drive ("HDD") storing an operating system such as WINDOWS®, VISTA®, UNIX®, LINUX®, etc. . . . operating system to coordinate interactions between the various components of the controller 22 and measurement system 10. A bus system provides one or more communication channels along which electronic signals are communicated between the various components of the controller 22, and an input/output interface ("I/O interface") facilitates and optionally translates signals input and output between the controller 22 and peripheral components such as a keyboard, mouse, touch screen interface, and the like. One or more suitable network adaptors, such as a 10/100 Base-T Ethernet adaptor, and IEEE 802.1x wireless transceiver, for example, can be included as part of the I/O interface to enable communication of data between the controller and a network.

The computer-readable memory 32 provided in communication with the controller 22 stores computer-executable instructions defining the plurality of tests, also interchangeably referred to herein as procedures, to be conducted by each testing device 14, 16 on the DUT 18. When these computer-executable instructions are executed by the processor provided to the controller 22, the controller 22 initiates the tests to be performed in parallel, sequentially, or a combination thereof.

Figure 2:
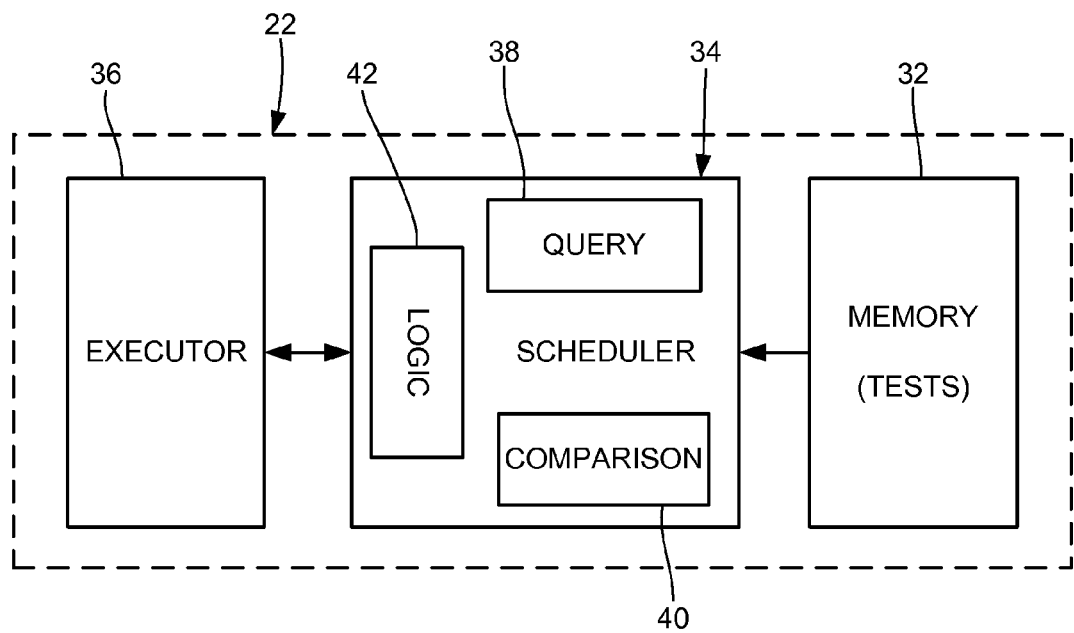
FIG. 2 is a block diagram illustrating a portion of a controller according to an embodiment of the present invention.

FIG. 2 is a block diagram illustrating a portion of the controller 22, which, as shown includes the memory 32 storing the tests to be performed by the measurement system 10, a scheduler component 34 that schedules when the tests stored by the memory 32 are to be initiated by an executor 36. The executor 36 can include the CPU provided to the controller 22, and is operable when programmed with the computer-executable instructions defining the tests to initiate performance of said tests.

As shown in FIG. 2, the scheduler component 34 includes a query tool 38, a comparison component 40 and a logic component 42 that cooperate to designate at least a first test and a second test from the plurality of tests stored in the memory 32 to be conducted on the DUT 18 in parallel. As described in detail below, designating the first and second tests to be conducted in parallel is based at least in part on the content of the computer-executable instructions defining the first test and the second test themselves.

Figure 3:
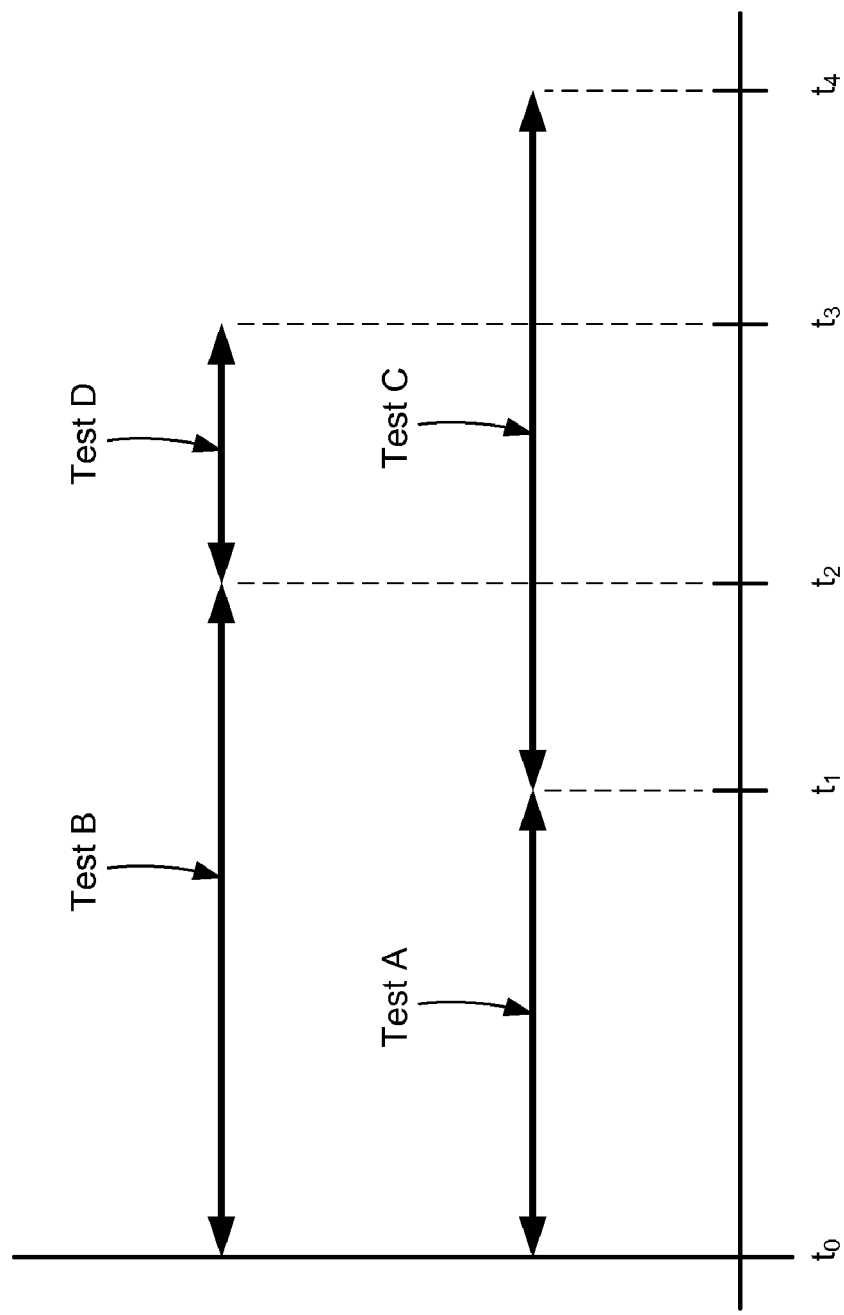
FIG. 3 is a timing diagram illustrating tests conducted in parallel to each other and other tests conducted sequentially relative to a previous test.

Two tests being conducted in parallel can be best understood with reference to the timing diagram shown in FIG. 3. Two tests being conducted on the DUT 18 in parallel at least partially overlap, meaning that for at least a moment they are both being performed on the DUT 18 simultaneously. One of the tests may be initiated before the other test, and one of the tests may be completed before the other test, but at some point during the two tests, both tests are being conducted on the DUT 18. In FIG. 3, Test A and Test B are initiated at approximately the same time $t_0$ when the controller 22 initiates testing. From time $t_0$ to time $t_1$ Test A and Test B are being conducted in parallel.

At time $t_1$, Test A is completed and Test C is initiated by the controller 22. From time $t_1$ to time $t_2$, Test C is being conducted in parallel with Test B, which continues until time $t_2$ when Test B is completed. However, Test C is conducted sequentially relative to Test A, which must be completed before Test C is initiated by the controller 22. Tests conducted sequentially have a conflict that prevents them from being conducted in parallel with each other. Thus, after Test A is completed Test C is initiated.

Also at time $t_2$ Test D is initiated sequentially relative to Test B. From time $t_2$ to time $t_3$ Test C and Test D are also conducted in parallel when, at time $t_3$ Test D is completed. For the example illustrated in FIG. 3, Test C continues to be conducted on the DUT 18 alone, until it is completed at time $t_4$. More than two tests can be conducted in parallel, and there can be more than four tests total without departing from the scope of the present invention.

Regardless of the number of tests being conducted in parallel, each test conducted in parallel must be compatible with all of the other tests being conducted in parallel with that test. Thus, in the example illustrated in FIG. 3, Test B is conducted in parallel with both Test A and Test C since there is at least a partial overlap between the time Test B is conducted with the times that Tests A and C were conducted. Thus, Test B must be compatible, or in other words must not have a conflict with Test A or Test C.

A conflict between tests can be any condition involving any portion of the measurement system 10, the DUT 18, or a combination thereof, that would prevent one or both tests from being conducted or yield inaccurate test results if the conflicting tests were conducted in parallel. A resource conflict is one such condition involving the measurement system 10 that prevents conflicting tests from being conducted in parallel. A resource conflict can be any conflict that arises between tests because due to overlapping usage of resources of the measurement system 10 during testing if the tests were conducted in parallel. An example of such a resource conflict can arise if conflicting tests each require a different signal output by the DUT 18 during the tests to be introduced to the measurement system 10 via the same input pin (not shown) of a multi-pin probe (not shown) that communicates with the DUT 18 during the tests. The same pin can not establish communication with the DUT 18 at more than one location at a time. But even if it could two different signals from the DUT 18 (each possibly in response to a different stimulus) can not be introduced to the measurement system 10 via the same pin, at the same time and produce accurate test results. Other examples of resource conflicts include two tests that must utilize: a common testing device 14 at the same time during testing, a common source (not shown) such as a waveform generator that generates an electric or other suitable signal to energize or otherwise stimulate the portion of the DUT 18 during testing, and the like.

Similarly, a dependency conflict that could keep two tests from being conducted by the measurement system 10 on the DUT 18 in parallel is caused by the dependence of one test on the result of a conflicting test. The result of the conflicting test must be determined before the other test can be conducted, and therefore the two tests can not be conducted in parallel. In FIG. 3, if conducting Test C was dependent on the result of Test A, for example, then this would be a reason why Test C was conducted sequentially relative to Test A. In fact, Test C may not be necessary depending on the results of Test A, and thus, conducting Test C in parallel with Test A could result in unnecessary tests being conducted as well as a waste of time and measurement system 10 resources.

Another example of a conflict that can prevent tests from being conducted in parallel includes an interference conflict. Such a conflict exists when two different portions of the DUT 18 are to be tested by the measurement system 10, but energizing or otherwise stimulating one of the portions has an effect on the other portion. Since the effect can alter the test result of the other portion of the DUT 18 unpredictably the two tests on the two different portions of the DUT 18 can not be tested in parallel under such circumstances. Or, according to an alternate embodiment, if two different tests requiring different stimuli are to be conducted on the same portion of the DUT 18, then these two different tests could not be performed in parallel, and instead, must be performed sequentially.

Referring once again to FIG. 2, the CPU of the controller 22 can be programmed with computer-executable instructions stored on a computer readable medium as the query tool 38. The query tool 38 scans the content of the computer-executable instructions defining the tests to be conducted by the measurement system 10 on the DUT 18 to identify factors that affect whether any of the tests can be conducted in parallel with other tests. According to an embodiment, the query tool 38 can scan the contents of the computer-executable instructions, in object code or source code form, defining the tests to identify one or more of the following pieces of conflict information: a testing device 14, 16 resource to be utilized in conducting each of the tests, a portion of the DUT 18 on which each of the tests are to be conducted, and dependencies of the tests on the result of one or more other tests.

In scanning the content of the computer-executable instructions defining the tests, the query tool 38 can do a string search for statements known to be used by the developers of the computer-executable instructions to be resource declaration statements. For example, variables such as RES1 can be declared in the source code written in the C programming language or other suitable language. When the query tool 38 finds an occurrence of this variable it can determine from a master list of variables that the RES1 variable will represent a voltage measurement, and that one resource to be used in conducting this test will be a voltmeter testing device 14. Depending on the programming language and scheme used in developing the computer-executable instructions, the resources utilized for each test can optionally be declared in a resource block at a known location in the code. A resource block can be associated with each resource of the measurement system 10 to be utilized to conduct each test, and can be designated for allocation of testing device 14, 16 and other measurement system 10 resources. Similar statements included in the content of the computer-executable instructions can optionally be provided using known code to identify portions of the DUT 18 to be tested during each test, and to identify any dependencies of each test on other tests as well.

The scheduler component 34 also includes a comparison component 40 which, like the query tool 38, includes the CPU of the controller 22 programmed to compare any of the items identified by the query tool 38 for one test to the same item identified by the query tool 38 for another test. The comparison tool 40, based on this comparison, can determine if the items identified by the query tool 38 for different tests create any conflicts that would prevent any of the tests from being conducted in parallel.

The logic component 42 in communication with the comparison component 40, evaluates the comparison results generated by the comparison component 40 to determine if a conflict exists between any tests that would prevent those tests from being conducted in parallel. The logic component 42 can include the CPU of the controller 22 programmed to determine a conflict exists between tests if the comparison results match for two tests. According to alternate embodiments, the logic component can include electronic circuit components to execute logical if/then or other suitable operations to evaluate the comparison results.

According to an embodiment, the tests that can be conducted in parallel as determined by the cooperation of the query tool 38, comparison component 40 and logic component 42 are grouped into phases. Each phase includes only tests that can be conducted in parallel with the other tests therein. The executor 36 portion of the controller 22 initiates at least two tests included in the first phase to be conducted in parallel. Once at least one of the tests in the first phase has been completed, a test in the second phase that could not be conducted in parallel with the test that has been completed is then initiated by the executor 36. But as discussed above, the test of the second phase so initiated by the executor 36 must be identified as being capable of being conducted in parallel with any tests from the first phase that are still in progress when the test from the second phase is initiated. Likewise, if the test from the second phase is completed before all tests in the first phase are complete, then a test from the third phase can be completed so long as the test from the third phase has no conflicts with any of the tests from the first or second phases that are still in progress.

Figure 4:
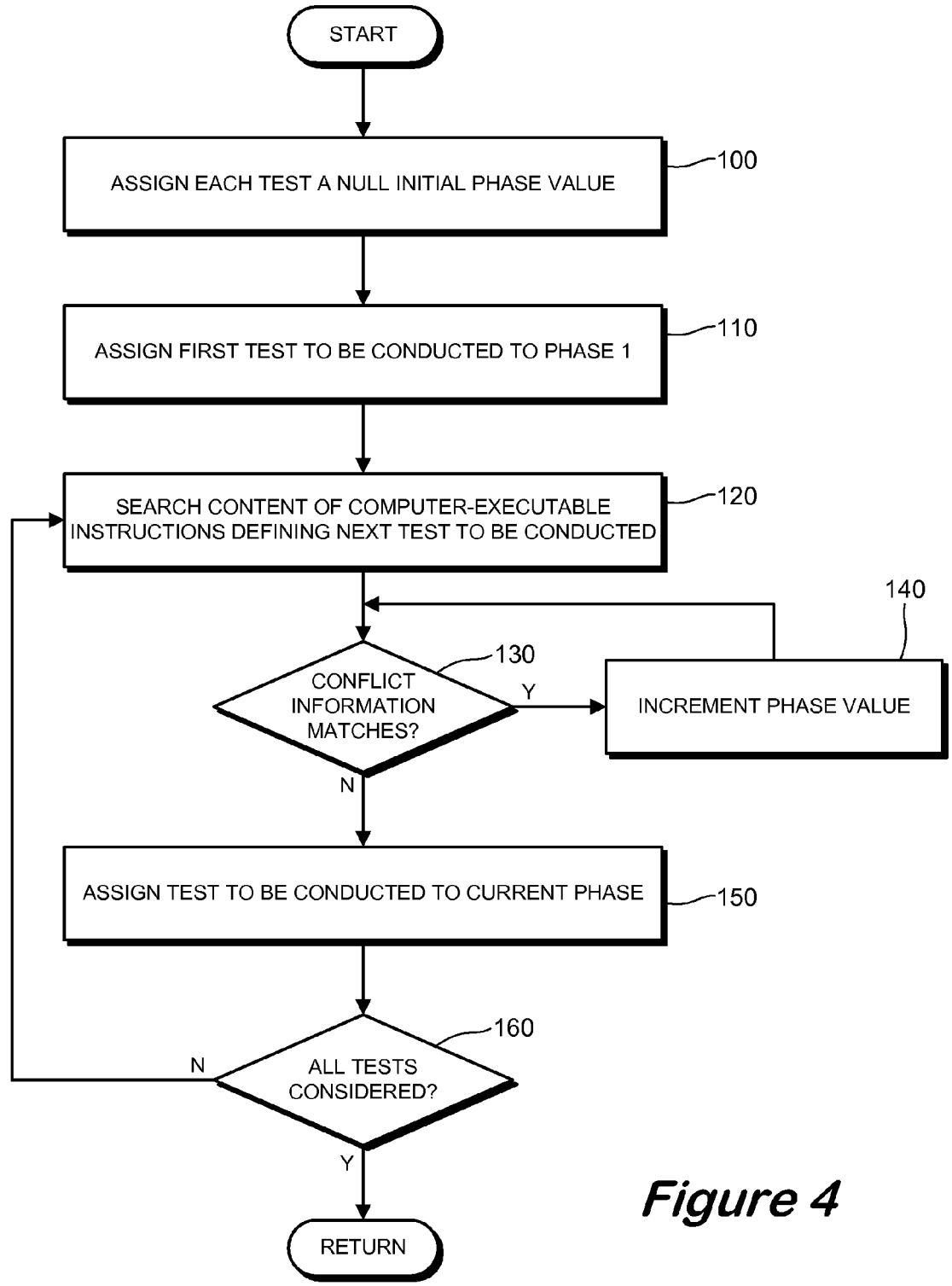
FIG. 4 is a flow diagram graphically depicting a method of grouping tests to be conducted in parallel on a DUT into phases.

Grouping of tests into phases to maximize the number of tests that can be conducted in parallel can best be understood with reference to FIG. 4. To group tests into phases, each test has a phase variable associated with it. The phase variable may take on two or more values depending on the number of phases that must be established due to the conflicts present for the tests to be conducted on the DUT 18. Before testing begins, the phase value for each test can initially be assigned a null value at step 100, which informs the controller 22 that the tests have not yet been allocated into a phase.

The first test to be conducted can be automatically assigned to the first phase by default at step 110, and its phase value changed to 1. The query tool 38 then begins to search through tests and the content of their respective computer-executable instructions stored in the computer-readable memory 32 at step 120 for information useful to determine whether a conflict exists between this next test and the first test to be conducted. Examples of such information were provided above, and include, but are not limited to: resource declarations in the computer-executable instructions, dependency information in the computer-executable instructions, and information regarding the portions of the DUT 18 to be tested by each test.

Responsive to locating such conflict identifying information, or any combination thereof, the located conflict identifying information for the second test is compared to that for the first test at step 130 to determine if there are any matches between the conflict information. If the comparison component 40 at step 130 determines a conflict does exist, then the logic component 42 increments the phase value for that test at step 140 and the comparison is repeated. But this time the conflict identifying information of the second test is compared to that information for any other test having the same value as the second test after its phase value has been incremented. If there are not tests already having the same phase value of the incremented value for the second test, then by default the second test is assigned that phase value and the process continues with the next test.

If, at step 130 it is determined that the conflict information for the second test does not match the conflict information for the first test, then the second test is also assigned a phase value of 1 at step 150, thereby designating the first and second tests to be initiated and conducted in parallel by the controller 22. If the computer readable instructions have not yet been evaluated for all tests to be conducted as determined at step 160, then the process resumes at step 120 by evaluating the computer-executable instructions for the third test for conflict information.

Each test assigned a phase value of 1 is to be initiated by the controller 22 in parallel with the other tests assigned a phase value of 1. Tests having a phase value of 2 are initiated sequentially relative to the tests having a phase value of 1, but in parallel with the other tests having a phase value of 2, and so on.

Once a phase, such as the tests assigned a phase value of 1, has been filled, has been provided with a sufficient number of tests, or is explicitly requested to be initiated, then the executor 36 of the controller 22 is invoked to begin initiating the tests in that phase. As each test in the phase is completed, a test from the immediately sequential phase, such as phase 2 in the current example, can be initiated by the executor 36, so long as the test in phase 2 has no conflicts with any of the tests with a phase value of 1 that are still in progress. The tests having a phase value of 1 can be initiated by the executor 36 even before all of the tests conflicted from the phase of tests with a phase value of 1 have been grouped in another phase. In other words, once it is appropriate for the tests with phase value of 1 to be initiated, those tests can be initiated while the remaining tests are grouped into phases.

There may be a "sufficient" number of tests, for example, when there is at least one set of tests that is adequate to perform a standalone action, and has no dependencies to any other tests. Further, the initiation and execution of tests can be optimized. This is especially true when as many compatible (i.e., non-conflicting tests that can be run in parallel) tests are grouped together in a phase as possible, and running them concurrently. In other words, by dividing the tests into the smallest possible number of groups, the procedures can run at the maximum efficiency.

The embodiments described above scheduled the tests to be conducted into phases as part of a pre-test scheduling routine carried out by execution of the computer-executable instructions. According to an alternate embodiments, the tests are initiated in parallel with other ongoing tests in real-time, without first being ordered by a pre-test scheduling routing. According to such embodiments, the tests can be initiated in an order in which the tests were made available to the measurement system 10, for example, or any other desired order.

Figure 5:
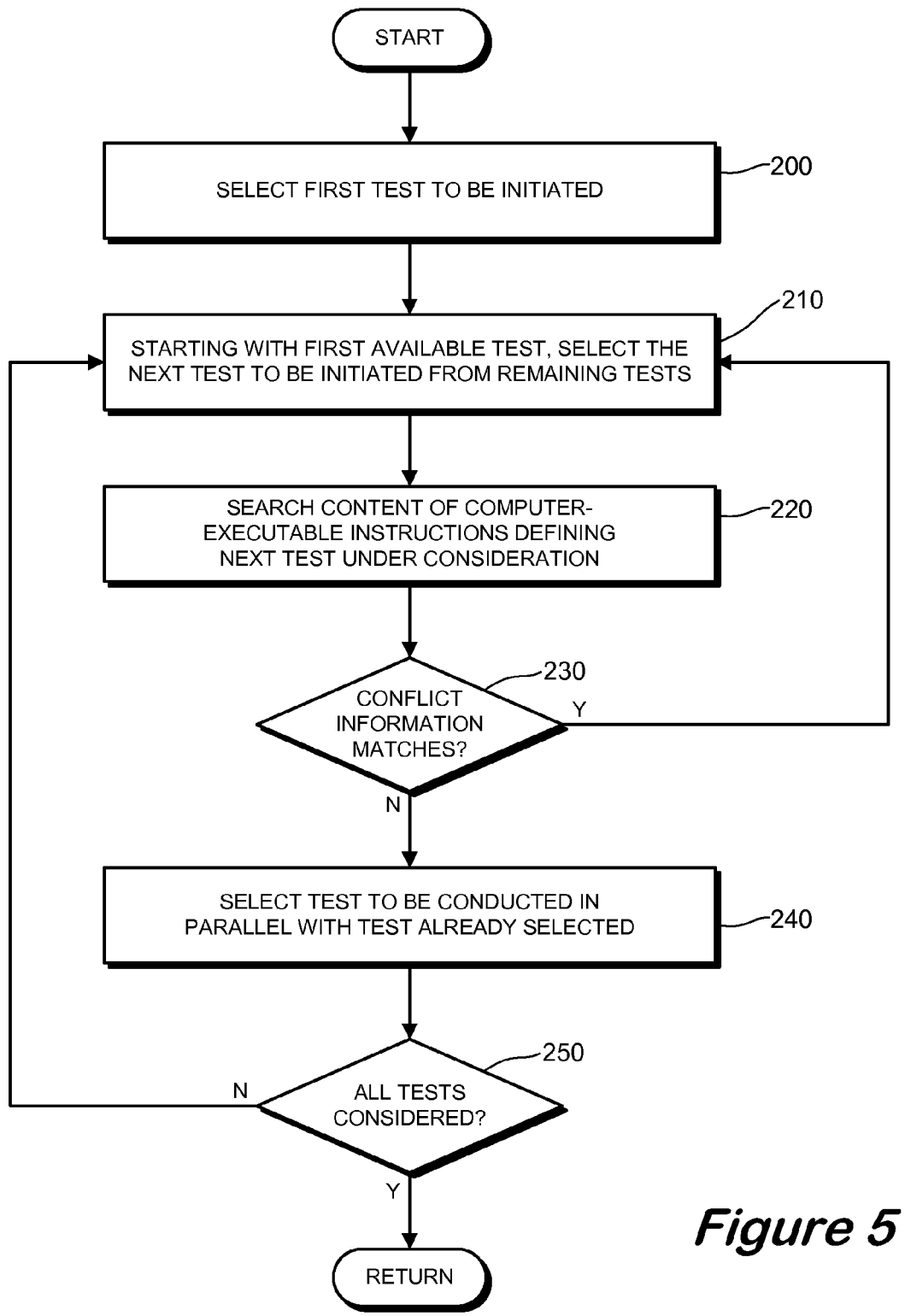
FIG. 5 is a flow diagram graphically depicting a method of selecting tests to be conducted in parallel according to an alternate embodiment.

An alternate embodiment where the tests can be initiated in parallel without first being sorted into phases during a pre-test sorting routine is illustrated in FIG. 5. As shown, the first test to be conducted on the DUT 18 is initiated at step 200. The first test can be the test that was made available to the measurement system 10 first in time; a randomly selected test; a test requiring the greatest amount of time to complete of all tests to be performed on the DUT 18; a test requiring the least amount of time to complete of all tests to be performed on the DUT 18; a test manually designated as being the first test to be performed; a test that produces results from which the greatest number of subsequent tests depend; a test selected in any other manner; or any combination thereof.

Once a test has been selected to be initiated as the first test that test can be initiated and a second test to be initiated can be selected at step 210 from the remaining pool of tests to be conducted on the DUT 18. Similar to the selection of the first test to be initiated, the second test can be selected using the same, or different criteria such as: the second test can be the test that was made available to the measurement system 10 second in time, immediately after the first test; a randomly selected test, a test requiring the greatest amount of time to complete of all remaining tests to be performed on the DUT 18, a test requiring the least amount of time to complete of all remaining tests to be performed on the DUT 18; a test manually designated as being the second test to be performed; a test that produces results from which the greatest number of remaining subsequent tests depend; a test selected in any other manner; or any combination thereof.

The second test to be initiated selected at step 210 is also evaluated to identify any potential conflict identifying information. The computer-executable instructions defining second test are searched for conflict information at step 220, and compared to any conflict information found in the computer-executable instructions defining the first test, which may be underway. The conflict information found in the computer-executable instructions defining the first and second tests is compared at step 230 to determine if the first and second tests can be conducted in parallel.

If, at step 230 it is determined that there are no conflicts that would prevent the second test from being conducted in parallel with the first test, then the second test can be selected to be initiated in parallel with the first test at step 240. If the first test is already underway, then the second test can be initiated while the first test is being performed. It is then determined at step 250 whether all tests have been considered. If not, then the method returns to selecting the next test to be initiated in parallel with another test already selected at step 210.

If at step 230, however, it is determined that a conflict will prevent the second test from being conducted in parallel with the first test, then the method moves on to consider the third test as a candidate to be conducted in parallel with the first test back at step 210. Since the second test has already been considered and disqualified from being conducted in parallel with the first test, the third test of the remaining tests is considered to be the first available candidate of the remaining tests to be performed at step 210. Just as with the second test, the computer-executable instructions of the third test are searched at step 220 for conflict information.

Unlike the consideration of the second test, however, the conflict information of the third and subsequent tests under consideration must be compared at step 230 to the conflict information identified from the computer-executable instructions of all tests underway at that time. If it was determined that the second test conflicted with the first test and couldn't be conducted in parallel with the first test, then only the first test could be underway at this time. Thus, the conflict information found in the computer-executable instructions defining the third test is compared with the conflict information for the first test at step 230. On the other hand, if it was determined that the second test did not conflict with the first test and could be conducted in parallel with the first test, then the conflict information found in the computer-executable instructions defining the third test is compared with the conflict information for both the first and second tests at step 230.

If there is no conflict between the third test and the tests underway as determined at step 230, then the third test is selected at step 240 to be conducted in parallel with the tests underway at that time, and can be initiated in parallel. Again it is determined at step 250 whether all tests have been considered, and if not, the method resumes by selecting the first available test that remains at step 210. If, for example, the second test conflicted with the first test but the third test was selected to be conducted in parallel with the first test, then the first available test is again the second test. If the first test has concluded, then the second test will be evaluated for potential conflicts with the third test if it is still underway at that time. If both the first and third tests are still underway, then the first available test the next time through is the fourth test, since it has already been determined that the second test conflicts with the first test.

The method continues by selecting the next available test using any suitable criteria, such as those discussed above with regard to the first and second tests until it is determined at step 250 that all tests have been considered and have been selected to be initiated. When step 250 is answered in the affirmative the method can begin again for the tests to be conducted on a subsequent DUT 18. In this manner, the time required to group parallel tests into phases during a pre-test routine is avoided, and instead, the tests can be initiated in real time.

As an alternative embodiment, if the second test conflicts with the first test as determined according to the method described with reference to FIG. 5, then the second test can optionally be set to be initiated immediately upon termination of the first test. For example, an interrupt can be set to break progress of the method, but not interrupt the tests being performed, when the first test is concluded. An interrupt is merely an asynchronous signal that is transmitted upon the occurrence of a predetermined event which, in the present example, is the conclusion of the first test, to indicate that the triggering event has indeed occurred. Due to the interrupt there is no need to again compare the second test to the first test for conflicts because it is known that the first test has been completed, and is no longer in progress. Thus, the second test need only be compared to any tests currently underway for conflicts between the second test and each of the respective tests underway to determine if the second test can not be initiated in parallel with those tests that are underway. A similar interrupt can optionally be set for each test that is found to conflict with a test that is underway when considered.

Illustrative embodiments have been described, hereinabove. It will be apparent to those skilled in the art that the above devices and methods may incorporate changes and modifications without departing from the general scope of this invention. It is intended to include all such modifications and alterations within the scope of the present invention.

What is claimed is:

1. A measurement system for testing a device under test (DUT), said system comprising:
   a plurality of testing devices for interacting with the DUT and conducting a plurality of different tests on the DUT;
   a computer-readable memory for storing computer-executable instructions defining the plurality of tests to be conducted by the testing devices on the DUT;
   a scheduler component for designating at least a first test and a second test from the plurality of tests to be conducted on the DUT in parallel, wherein said designating is based at least in part on content of the computer-executable instructions defining the first test and the second test;
   a controller operable to read and execute said computer-executable instructions, said controller initiating the first test and the second test to be conducted in parallel and initiating at least a third test sequentially after at least one of the first and second tests wherein said first test, said second test and said third test may or may not be unique and the scheduler component comprises:
- a query component for identifying from the computer-executable instructions defining the first and second tests a testing device resource to be utilized in conducting each of the first and second tests;
- a comparison component for comparing the testing device resource to be utilized in conducting the first test to the testing device resource to be utilized in conducting the second test; and
- a logic component for determining that the testing device resource to be utilized in conducting the first test does not conflict with the testing device resource to be utilized in conducting the second test.

2. The measurement system according to claim 1, wherein the scheduler component designates the third test to be performed sequentially based at least in part on content of the computer-executable instructions defining the third test.

3. The measurement system according to claim 1, wherein the query component extracts the testing device resource to be utilized in conducting each of the first and second tests from resource declaration statements in the computer-executable instructions.

4. The measurement system according to claim 3, wherein the resource declaration statements are collected in a resource block within the computer-executable instructions designated for allocation of testing device resources.

5. The measurement system according to claim 1, wherein designating at least the first test and the second test to be conducted on the DUT in parallel by the scheduler component comprises:
- identifying from the computer-executable instructions defining the first and second tests relative portions of the DUT on which the first and second tests are to be conducted;
- comparing the portion of the DUT on which the first test is to be conducted to the portion of the DUT on which the second test is to be conducted; and
- determining that conducting the first and second tests on the relative portions of the DUT will not create a conflict.

6. The measurement system according to claim 1, wherein designating at least the first test and the second test to be conducted on the DUT in parallel by the scheduler component comprises:
- identifying from the computer-executable instructions defining the first and second tests a dependency of the second test on another test result;
- comparing the another test result to a test result of the first test; and
- determining that the another test result is not the same as the test result of the first test.

7. The measurement system according to claim 1, wherein the content of the computer-executable instructions defining the first and second tests is adapted for conducting the first and second tests sequentially.

8. The measurement system according to claim 1, wherein the scheduler component designates a destructive test to be conducted on a portion of the DUT after all non-destructive tests have been conducted on the portion of the DUT.

9. A method of testing a device under test (DUT) to determine if the DUT functions properly, the method comprising:
- querying with a controller computer-executable instructions defining a plurality of tests stored by a computer-readable medium for a conflict between the tests, wherein said conflict interferes with conducting the tests in parallel;
- based on said querying, scheduling a first test and a second test that is compatible with the first test to be conducted on the DUT in parallel;
- based on said querying, scheduling a third test that conflicts with the first test to be conducted on the DUT sequentially after the first test wherein said first test, said second test and said third test may or may not be unique;
- and said querying comprising:
  - identifying from the computer-executable instructions defining the first and second tests a testing device resource to be utilized in conducting each of the first and second tests;
  - comparing the testing device resource to be utilized in conducting the first test to the testing device resource to be utilized in conducting the second test; and
  - determining that the testing device resource to be utilized in conducting the first test does not conflict with the testing device resource to be utilized in conducting the second test; and
- performing said tests.

10. The method according to claim 9, wherein said querying further comprises:
- identifying a portion of the DUT on which the first and second tests are to be conducted within the computer-executable instructions defining the first and second tests;
- comparing the portion of the DUT on which the first test is to be conducted to the portion of the DUT on which the second test is to be conducted; and
- determining that the first test does not conflict with the second test when the first and second tests are to be conducted on different portions of the DUT.

11. The method according to claim 10, wherein the different portions of the DUT are electrically isolated from each other.

12. The method according to claim 10, wherein identifying the testing device resource comprises extracting the testing device resource to be utilized in conducting each of the first and second tests from resource declaration statements in the computer-executable instructions.

13. The method according to claim 12, wherein the resource declaration statements are collected in a resource block within the computer-executable instructions designated for allocation of testing device resources.

14. The method according to claim 9, wherein said querying further comprises:
- identifying from the computer-executable instructions defining the first and second tests a dependency of the second test on another test result;
- comparing the another test result to a test result of the first test; and
- determining that the another test result is not the same as the test result of the first test.

* * * * *